US011203293B2

(12) United States Patent
Ochoa Nieva

(10) Patent No.: US 11,203,293 B2
(45) Date of Patent: Dec. 21, 2021

(54) SYSTEM FOR DETECTING ACTIVITIES THAT POSE A RISK DURING DRIVING, BASED ON CHECKING THE POSITION OF THE TWO HANDS ON THE STEERING WHEEL

(71) Applicant: Ignacio Javier Ochoa Nieva, Navarra (ES)

(72) Inventor: Ignacio Javier Ochoa Nieva, Navarra (ES)

( * ) Notice: Subject to any disclaimer, the term of this patent is extended or adjusted under 35 U.S.C. 154(b) by 0 days.

(21) Appl. No.: 16/977,507

(22) PCT Filed: Mar. 26, 2019

(86) PCT No.: PCT/ES2019/070195
§ 371 (c)(1),
(2) Date: Sep. 2, 2020

(87) PCT Pub. No.: WO2019/185959
PCT Pub. Date: Oct. 3, 2019

(65) Prior Publication Data
US 2021/0053488 A1    Feb. 25, 2021

(30) Foreign Application Priority Data
Mar. 28, 2018    (ES) ................ P201830320

(51) Int. Cl.
*B60Q 9/00*    (2006.01)
*B60K 35/00*    (2006.01)
(Continued)

(52) U.S. Cl.
CPC ............... *B60Q 9/00* (2013.01); *B60K 35/00* (2013.01); *B60Q 1/52* (2013.01); *B60Q 5/005* (2013.01);
(Continued)

(58) Field of Classification Search
None
See application file for complete search history.

(56) References Cited

U.S. PATENT DOCUMENTS 4,219,800 A * 8/1980 LeViness ............. A61B 5/1107
200/61.57
5,874,892 A * 2/1999 Antonellis ............. B60Q 5/003
340/438
(Continued)

FOREIGN PATENT DOCUMENTS

FR         3023519 A1    1/2016
WO    WO-2006121996 A1 * 11/2006 ............. G08B 21/06
(Continued)

OTHER PUBLICATIONS

International Search Report and Written Opinion for PCT/ES2019/070195 dated Oct. 3, 2019.

*Primary Examiner* — Fekadeselassie Girma
(74) *Attorney, Agent, or Firm* — Thomas | Horstemeyer, LLP

(57) ABSTRACT

A system for detecting activities that pose a risk during driving is described. The system includes a vehicle comprising a steering device. Sensors are placed around various positions of the steering device that are configured to detect a presence of one or two hands on the steering device. The system further includes processing circuitry configured to: identify a position of the one or two hands on the steering device or a lack thereof based on binary signals received from the plurality of sensors; and determine whether to generate an alert to the operator of the vehicle based on the position of the one or two hands on the steering device or lack thereof, the alert requesting the operator of the vehicle to place one or two hands on the steering device and/or any other authorized device.

14 Claims, 1 Drawing Sheet

(51) Int. Cl.
*B60Q 1/52* (2006.01)
*B60Q 5/00* (2006.01)
*B62D 1/04* (2006.01)
*B62D 1/06* (2006.01)
*B60R 16/023* (2006.01)

(52) U.S. Cl.
CPC .............. *B62D 1/046* (2013.01); *B62D 1/06* (2013.01); *B60K 2370/178* (2019.05); *B60R 16/0231* (2013.01)

(56) References Cited

U.S. PATENT DOCUMENTS

| | | | | |
|---|---|---|---|---|
| 6,218,947 | B1 * | 4/2001 | Sutherland | G08B 21/06 180/272 |
| 6,609,768 | B1 * | 8/2003 | Frank | B60T 7/107 200/61.57 |
| 6,859,143 | B2 | 2/2005 | Braeuchle | B60Q 1/0076 180/272 |
| 8,451,109 | B1 * | 5/2013 | Daniel | B60K 28/066 340/439 |
| 9,045,074 | B2 * | 6/2015 | Piasecki | B60Q 9/00 |
| 10,502,616 | B2 | 12/2019 | Clochard | G01J 1/0238 |
| 10,793,063 | B1 * | 10/2020 | Samuel, Jr. | B60Q 3/80 |
| 10,926,786 | B2 * | 2/2021 | Jendrowski | B60K 37/06 |
| 10,963,967 | B1 | 3/2021 | Lafeir | B60Q 9/00 |
| 11,027,764 | B2 * | 6/2021 | Chow | B62D 1/046 |
| 11,072,349 | B2 * | 7/2021 | Augst | B60W 50/16 |
| 11,094,080 | B2 * | 8/2021 | Schiebener | G06K 9/00375 |
| 2008/0042856 | A1 * | 2/2008 | Power | G08B 21/06 340/575 |
| 2008/0061954 | A1 * | 3/2008 | Kulas | B60K 35/00 340/438 |
| 2008/0143504 | A1 * | 6/2008 | Martin Alvarez | B60K 28/066 340/439 |
| 2011/0115617 | A1 * | 5/2011 | Bennett | B60Q 1/50 340/439 |
| 2011/0133919 | A1 * | 6/2011 | Evarts | B60Q 9/00 340/439 |
| 2012/0028682 | A1 * | 2/2012 | Danne | B60R 11/02 455/557 |
| 2013/0009761 | A1 * | 1/2013 | Horseman | A61B 5/18 340/425.5 |
| 2014/0121903 | A1 * | 5/2014 | Lee | B60K 37/06 701/41 |
| 2014/0300458 | A1 * | 10/2014 | Bennett | A61B 5/18 340/439 |
| 2015/0307022 | A1 * | 10/2015 | Nelson | B60W 50/16 701/36 |
| 2017/0334392 | A1 * | 11/2017 | Frey | B60K 35/00 |
| 2019/0147263 | A1 * | 5/2019 | Kuehnle | G07C 5/0808 340/439 |
| 2019/0375431 | A1 * | 12/2019 | Garcia | B62D 1/046 |
| 2020/0216079 | A1 * | 7/2020 | Mahajan | B60W 40/09 |
| 2021/0078609 | A1 * | 3/2021 | Barth | G06K 9/00845 |
| 2021/0153806 | A1 * | 5/2021 | Ghannam | G16H 40/67 |

FOREIGN PATENT DOCUMENTS

| | | | |
|---|---|---|---|
| WO | WO-2010040452 A1 * | 4/2010 | .............. G08B 21/06 |
| WO | 2012062946 A1 | 5/2012 | |
| WO | WO-2015200224 A2 * | 12/2015 | .............. B60W 40/08 |

* cited by examiner

SYSTEM FOR DETECTING ACTIVITIES THAT POSE A RISK DURING DRIVING, BASED ON CHECKING THE POSITION OF THE TWO HANDS ON THE STEERING WHEEL

CROSS-REFERENCE TO RELATED APPLICATIONS

This application is a 35 U.S.C. § 371 national phase application of PCT/ES2019/070195 filed Mar. 26, 2019 entitled "SYSTEM FOR DETECTING ACTIVITIES THAT POSE A RISK DURING DRIVING, BASED ON CHECKING THE POSITION OF THE TWO HANDS ON THE STEERING WHEEL," which claims the benefit of and priority to Spanish Patent Application No. P201830320 filed Mar. 28, 2018, the contents of which being incorporated by reference in their entireties herein.

FIELD OF THE INVENTION

The embodiments described herein may be implemented in the automobile industry to avoid risky activities of the driver while driving. The aim of the system is to prevent the driver from performing most of the activities that induce a lack of attention while driving, as both hands are required to be simultaneously gripping the steering wheel while driving.

BACKGROUND

In recent years, the automotive industry has been developing a large number of inventions and developments to make driving a safer activity.

Some of the developments have been aimed at improving the static safety of vehicles, such as flexible chassis, better body designs, better shock absorbers, better brakes, etc.

The companies have made improvements in the dynamic safety of cars to make the driving easier for the drivers, in this section could be included ABS, ESP, ASR, slope assistance, etc.

There have also been improvements in the processes of some routines at the steering wheel, such as the automatic activation of the windscreen wiper, the automatic activation of lights in tunnels and in the twilight, etc.

Some devices have been included in cars to try to enforce the regulations regarding some mandatory use devices. This may include a warning beep when the driver has not fastened the seat belt. The beep is so annoying that occupants prefer to fasten their seatbelt than to drive listening to it.

The current technological challenge comes from driverless cars, tests are already being carried out with a clear and progressive improvement of them. In any case, an autonomous vehicle could suffer an accident, for instance, if a car driven by a clueless driver impacts it.

All the systems described above, and many others, have contributed to the reduction of accidents while driving, but is this enough? Clearly not, hundreds of people involved in road accidents die every year.

One of the biggest causes of traffic accidents comes from inattention and distractions while driving. So far, this issue is still in the process of finding a solution.

Part of this lack of attention and/or distractions are caused by sleep or fatigue. Car manufacturers and authorities have taken various initiatives aimed at solving this issue.

In recent years, many governments have carried out numerous awareness-raising campaigns, so that drivers must stop to rest, at least once every two hours of driving or every 200 km, or, in case that the driver feels tired or drowsy. In fact, the current traffic code in Spain considers driving under these circumstances to be punishable.

Automobile companies have also invested a lot of effort to developing technologies capable of detecting these states of fatigue and/or drowsiness, in order to prevent the driver in one way or another. Then, he may proceed to stop and take a rest.

In recent times, some devices have arrived, capable of taking control of the vehicle for a few seconds if the system detects that the driver has fallen asleep.

Some of these devices are currently in the testing stage.

These developments have also achieved different levels of success and applicability. Let's take a brief look at the different technologies and devices designed to detect the driver's fatigue.

One of the first systems developed, consisted of a helmet with multiple electrodes, capable of monitoring brain activity and detecting driver fatigue or sleep. The system worked reasonably well, but it was so disturbing, that it was not a device that could be used regularly, in daily driving.

The Jaguar/Land Rover company has developed a system capable of detecting brain activity through specialized sensors located on the steering wheel. With these sensors, and through the hands, the system is able to detect fatigue and sleep in the driver. According to what has been published, it seems that the system is about to be applied in series-production cars.

Hoffman and Krippner have developed a fatigue detection system based on the pressure of the hands on the steering wheel. They have designed a system of pressure detectors, which, connected to a switchboard and following certain personalized patterns, are capable of detecting fatigue and/or sleep in the driver.

Some other initiatives have tried to control the position and movements of the driver's eyes to, again, using certain personalized patterns, detect fatigue, and/or sleep in the driver. Portable systems have even been developed with this technology.

Other initiatives have been aimed by means of artificial vision, personalized patterns and certain algorithms to detect the position of the hands inside the passenger compartment, trying to detect fatigue and/or sleep in the driver, again, due to their behavior while driving.

In summary, most of the developments are aiming at controlling distractions while driving has focused their attention on driver fatigue and sleep. But this is insufficient again, it's required to evolve from this point.

BRIEF SUMMARY OF THE INVENTION

A system for detecting activities that pose a risk during driving is described, comprising a vehicle comprising a steering device; a plurality of sensors placed around various positions of the steering device configured to detect a presence of one or two hands on the steering device; and a processing circuitry configured to: identify a position of the one or two hands on the steering device or a lack thereof based on binary signals received from the plurality of sensors; and determine whether to generate an alert to the operator of the vehicle based on the position of the one or two hands on the steering device or lack thereof, the alert requesting the operator of the vehicle to place one or two hands on the steering device and/or any other authorized device.

The plurality of sensors may operate based on binary signals placed on respective positions of the steering device is a first plurality of sensors. The system may further include at least: a second plurality of sensors placed on a main control panel of a center console of the vehicle; and a third plurality of sensors placed on a gear shift lever of the vehicle and other parts of the vehicle. The plurality of sensors may be capacitive sensors. The processing circuitry may be a portion of a control unit, where the binary signals received from the plurality of sensors are transmitted over a communication network of the vehicle.

The processing circuitry may be further configured to, generate a communication to alert an operator of another vehicle or people in the surrounding or an emergency service, and using light and/or audible signals including internal and/or external flashing lights, flashing hazard lights, lights and/or horn to communicate a warning alert to people in surrounding on detecting either a possible inappropriate and/or unexpected maneuver performed by the operator in response to two hands not being detected on the steering device and/or any other authorized device.

The processing circuitry may be further configured to generate a warning alert and to activate a "Dead Man" control after a preset time period on detecting no movement of hands of the operator for a preset time period to control fatigue and/or drowsiness and/or the driver's lack of attention and/or ensure no sabotage of the system, and wherein the "Dead Man" control requires hands of the operator to be released and placed back on the steering wheel in a certain synchronized sequence and order, and wherein the processing circuitry deactivates the "Dead Man" control on detecting movement and position of the hands of the operator in the certain synchronized sequence and order.

The processing circuitry may be further configured to access predefined window parameters in determining whether to generate the alert, the predefined window parameters being stored in memory, and customizable by a manufacturer and depending on local regulations.

A system for generating an alert on detecting risk activities while driving is further describe, the system comprising: a processing circuitry configured to detect risk activities performed by the operator of the vehicle on the basis of response to two hands not being detected on the steering device and/or any other authorized device; an alert generation system configured to generate at least one of: a warning alert by activating light and/or audible signals to alert the driver to place back both hands on the wheel, and/or any other authorized device; a warning alert by activating light and/or audible signals including internal and/or external flashing lights, flashing hazard lights, lights, horn, to communicate a warning alert to the operator, people in surrounding or an emergency service on detecting the risk activities alerting of possible inappropriate and/or unexpected maneuver performed by the operator; an alert that comprises at least one of light emission and/or a sound emission; and an alert to the operator of the vehicle based on the position of the one or two hands on the steering device and/or any other authorized device or lack thereof.

The processing circuitry may be further configured to generate a warning alert and to activate a "Dead Man" control after a preset time period on detecting no movement of hands of the operator for a preset time period to control fatigue and/or drowsiness and/or the driver's lack of attention and/or ensure no sabotage of the system, and wherein the "Dead Man" control requires hands of the operator to be released and placed back on the steering wheel in a certain synchronized sequence and order, and wherein the processing circuitry deactivates the "Dead Man" control on detecting movement and position of the hands of the operator in the certain synchronized sequence and order.

The processing circuitry may be further configured to access predefined window parameters in determining whether to generate the alert, the predefined window parameters being stored in memory and customizable by the manufacturer and depending on local regulations.

A method for detecting activities that pose a risk during driving is described, comprising: providing a vehicle comprising a steering device; providing a plurality of sensors configured to detect a presence of one or two hands on the steering device; identifying, by a control unit of the vehicle, a position of the one or two hands on the steering device or a lack thereof based on binary signals received from the plurality of sensors; and determining, by the control unit of the vehicle, whether to generate an alert to the operator of the vehicle based on the position of the one or two hands on the steering device or lack thereof, the alert requesting the operator of the vehicle to place one or two hands on the steering device and/or any other authorized device.

The plurality of sensors may operate based on binary signals placed on respective positions of the steering device is a first plurality of sensors. The method may further include providing a second plurality of sensors placed on a main control panel of the center console of the vehicle; and providing a third plurality of sensors placed on a gear shift lever of the vehicle and other parts of the vehicle. The plurality of sensors may be capacitive sensors.

The method may further include generating a communication to alert an operator of another vehicle or people in the surrounding or an emergency service, and using light and/or audible signals including internal and/or external flashing lights, flashing hazard lights, lights and/or horn to communicate a warning alert to people in surrounding on detecting either a possible inappropriate and/or unexpected maneuver performed by the operator in response to two hands not being detected on the steering device and/or any other authorized device.

The method may further include generating a warning alert and activating a "Dead Man" control after a preset time period on detecting no movement of hands of the operator for a preset time period to control fatigue and/or drowsiness and/or the driver's lack of attention and/or ensure no sabotage of the system, and wherein activating of the "Dead Man" control requires hands of the operator to be released and placed back on the steering wheel in a certain synchronized sequence and order, and wherein the processing circuitry deactivates the "Dead Man" control on detecting movement and position of the hands of the operator in the certain synchronized sequence and order.

The method may further include accessing predefined window parameters in determining whether to generate the alert, the predefined window parameters being stored in memory, and customizable by the manufacturer and depending on local regulations. The method may further including detecting risk activities while driving and generating warning alerts.

BRIEF DESCRIPTION OF THE DRAWINGS

Various embodiments of the present invention will now be described, by way of example only, with reference to the accompanying drawings. The components in the drawings are not necessarily to scale, with emphasis instead being placed upon clearly illustrating the principles of the disclosure.

DETAILED DESCRIPTION

Figure 1:
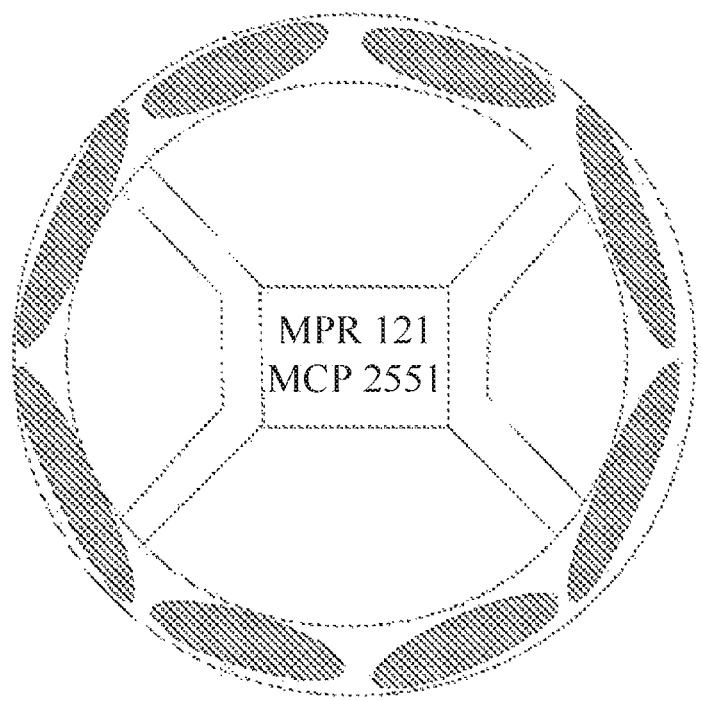
FIG. 1 is a drawing of the steering wheel from the rear in which a possible location of a capacitive or other type of detection electrodes are displayed as shaded which may be located behind a plastic, leather, or other material protection and hidden from view.

After this review of the state of the art, there is something that has not been paid the attention it deserves, or at least, has not been found a suitable solution yet.

As well as fatigue and/or sleep problems, there are other distractions, even more, common and may not be caused by fatigue and/or sleep. These are the distractions caused by elements and/or devices not related to the driving, but in the surroundings of the driver while driving. These elements induce the driver, in a way that carries out "Risk activities while driving." The following list, not trying to be complete, shows part of said "Risk activities while driving":

Read text messages/e-mails received on the mobile phone.
Send text messages/e-mails with the mobile phone.
Phone calls without "Hands-free" devices.
Drink while driving. Even more dangerous when the bottle needs to be opened.
GPS management.
Give yourself cream on your hands.
Eat any type of food.
Management of music devices other than those that can be operated from the steering wheel itself. Ipods, CDs, etc.
Reading maps while driving.
Nasal mining.
And a long number of those behaviors, become dangerous or very dangerous if are carried out while driving a vehicle.

The items in the previous list, have nothing to do, although in some cases it may be related, with unconscious fatigue and/or sleep on the driver while driving.

So, where's the problem?

The problem is that some drivers carry out too many activities while driving. These activities are done on long and on short trips. It is well known that an important number of traffic accidents occur during short trips.

On the short trips, the reason could be the lack of concentration of the driver, there are some routine trips where the route is very well known by the driver, etc. The truth is that an important part of these accidents occurs because of the lack of attention of the driver while is performing these "Risk activities while driving." Because these behaviors have been carried out little by little, but most of the times, are done by the driver, almost automatically and unconsciously.

On the long trips, these "Risk Driving Activities" may be carried out because of boredom. After a long time driving, the driver may not be paying due attention to the driving. Anyway, said the reason is not an obstacle to consider other causes.

Is it possible to minimize these behaviors, and avoid the performance of these "Risk Driving Activities"?

There is a common factor in most of the behaviors that lead the driver to carry out "Risk activities while driving." Most of the "Risk activities while driving" of vehicles, requires the participation of, at least, one of our hands. If the driver was not able to take his hands off the steering wheel while driving, he would not be able to perform such "Risky Activities While Driving." If it was possible to control the position of the hands by gripping the steering wheel, the driving will become much safer.

Having the answer, it's required a device capable of working for this purpose. It is clear that it's not possible to tie the driver's hands at the steering wheel.

Recorded messages and reminders asking for the driver's attention while driving are not very reliable. After some time listening to these messages, they become ineffective, because the driver unconsciously unattended at them.

What is required, is to have the control of both hands simultaneously gripping the steering wheel.

Accordingly, various embodiments for a system for detecting risky activities while driving based on control of the position of both hands gripping the steering wheel are provided. The system is based on a series of capacitive sensors, without excluding others of any other type, located around and on the backside of the steering wheel, with the purpose of checking that both hands are positioned around the steering wheel. These sensors will guarantee the detection of the driver's fingers by grabbing the steering wheel around it. The gear shift lever or the central control of the console may also be equipped with these sensors. This can help to inactivate some of the steering wheel signals in case the driver needs to change gears, in vehicles with a manual transmission, or the driving style, in vehicles with automatic transmission. It's going to be the same with the button on the center console, for example, to enable for the operation of the "Hands-free" device or other devices.

Ins some embodiments, there are included capacitive detectors, which allow the driver to control the correct position of the hands around the steering wheel without the need of executing any type of pressure or added action. There are not required complex artificial vision devices with complex algorithms. These are cheap and adaptable elements to any type of shape required and do not offer complexity during the installation process.

These sensors will send the signals to a control unit using the vehicle's communications BUS (CAN Bus). Said control unit, taking into account the "window parameters," will process the data and decide whether or not to activate the installed alarm signals.

These alarms signals may include:

Alerting the driver to place both hands around the steering wheel again, the system will use the well-known beep that warns the driver if the seat belt is not fastened or any other sound capable of achieving the same effect.

For alerting the rest of the road users, and the police if necessary, the flashing hazard lights will activate simultaneously with the alarm beeps, which will alert the rest of the road users. So the other drivers can be warned in advance of an inappropriate and/or unexpected maneuver(s) of the driver.

Any other type of warning, both light and sound may be incorporated to perform this function, depending on different needs or requirements.

As indicated, the detection system will have a set of "window parameters," which will allow to the inhibition of the warnings in certain circumstances. These are some of the "window parameters" that the system will include:

Vehicle speed. The system will start working from a certain speed, for example, 15 km/h. It could also be active all the time while the car is into the traffic.

The system will allow time for inhibition of the warnings in case that the driver is carrying out some tasks of adjusting the auxiliary elements for the driving, for example, 3 seconds.

The system will control the rotation position of the steering wheel, with a rotation above certain degrees will also inhibit the system for a certain period of time. During driving in more or less complicated situations, the system will not generate distractions for the driver. For example, by setting an operating sector within plus/minus 15° of the central position of the steering wheel, in this case, the system will inhibit the system for a certain time. For example, 10 seconds.

In the case of Vehicles with controls located on the central console, detectors will also be enabled on the said console, allowing the operation of these controls for a maximum of the time. For example, 5 seconds.

To avoid the sabotage of the system, from time to time, the driver must modify the position of the hands. This is a similar control that is used in machines with a high risk of entrapment, such as a hydraulic press.

A soft audible warning will be activated every certain time, for example, every 45 seconds, activating the "Dead Man" control. This system will work in a similar way to how it works on trains. This control will require the hands to be released and placed back on the steering wheel in a certain sequence and in a certain order. Slightly open the left hand, place the left hand around the steering wheel, slightly open the right hand, place the right hand around the steering wheel, within a certain period of time, for example, 300 ms. By doing the sequence In the required order, the Dead Man will be deactivated again for another period of time.

The system may consider, in addition to the above, a period of waiting time for activation of warnings, for example, 2 seconds, to carry out any activity not included among those contemplated in this text.

In any case, all these "Window parameters", and some new ones that may be included in the future, will be parameterizable by using the software of the manufacturer of the vehicle and/or device, in order to be adaptable to new needs that may appear and be adaptable to different legislations in different countries and to the possible changes in that could be included by the legislation in the future.

For all the audible warnings listed in this text, there will be an alternative set of lights to adapt the device to people with audition problems.

Let's see some examples of how driving would be after the application of this device:

Change of radio station. From the controls integrated into the steering wheel.

Phone calls. From the controls integrated into the steering wheel.

Regulation of the mirrors. The regulation of the mirrors must be done before the start of the driving.

Drink while driving. Drinking and driving at the same time is high-risk behavior. If you are thirsty, you must stop the vehicle in a safe area and then drink.

Eat while driving. Eating and driving at the same time is high-risk behavior. If you are hungry, you must stop the vehicle in a safe area and then eat.

Fatigue from keeping the position of the arms in the same position for too long. In this case, the driver should make a brief stop in a safe area and rest. In fact, currently, it is recommended to make a stop every 2 hours or 200 km traveled. Even before in the case of being tired or sleepy.

Send text messages while driving. It is a dangerous practice, if it is necessary to send a text message, the driver must stop the vehicle in a safe area, and then send the message.

The device may be used in combination with any other device able to collaborate in the detection of possible fatigue or lack of attention. With the explained device, driving will be safer, and the addition of any other system or technology could contribute to an increasing in said safety.

All the detectors indicated above will transmit their status to the car's control bus. These signals will be processed by a control unit, which will activate alert devices for controlling the hand positioning at the steering wheel depending on the implemented window parameters.

For the detection of the hands around the steering wheel, will be installed electrodes with shapes adapted to the design of the steering wheel, conveniently protected in terms of direct contact with the user. These electrodes will be connected to specific integrated circuits. Chips of the type MPR 121 or similar will be used, which will be connected to a microprocessor, which will process the signals received from each of the sensors and will transmit them to the control unit, dedicated or not, to the unit responsible of controlling the positioning of the hands around the steering wheel. The communication will be done via CAN Bus, using an MCP 2551 chip or similar. The system will have at least two units like those described above, one located on the steering wheel itself and connected to the spiral of the CAN Bus of the steering wheel and the second will be installed on the vehicle's dashboard to detect the location of the hands on the gear shift lever and the central control wheel of the vehicle console.

The control unit will be in charge of processing the signals received from the two units previously described and acting on the warning signals, as described in previous chapters.

As indicated above, the application of the system and the integration with CAN Bus will be carried out by connecting the output of the MCP 2551 chip or similar and transmitting the messages with a specific identifier to the CAN Bus. The system will use the flexibility that CAN Bus provides to communicate the different participants on the data bus. The two auxiliary control units, by means of specific dispatch identifiers, will induce data to CAN Bus, which will be received in the control unit, dedicated or not, of the hand detection system on the steering wheel. In addition to these data, data such as vehicle speed, steering wheel rotation, and any other, capable of providing necessary data for the system, will also be processed by the system. After that, the control unit will activate the necessary signals to alert the driver and the rest of the road users of the risk situation detected in the vehicle.

The system could be incorporated into new models, with specific designs, as well as existing cars by means of portable devices with simple installation on portable elements, including electrodes, duly protected and attached to the backside of the steering wheel.

As can be seen in the enclosed drawings, the detectors, in this case capacitive, will be located at the backside of the steering wheel, on the gear shift lever, adapting to the shape it may have and on the console's central wheel in the vehicles this device.

FIG. 1 is a schematic image of the steering wheel from the back, in which the possible location of the capacitive or other types of detection electrodes are displayed in shading, which will be located behind a plastic, leather or other material protection, being able to be hidden from the user's view. The location of the capacitive control chip and the CAN bus connection chip can also be seen.

Figure 2:
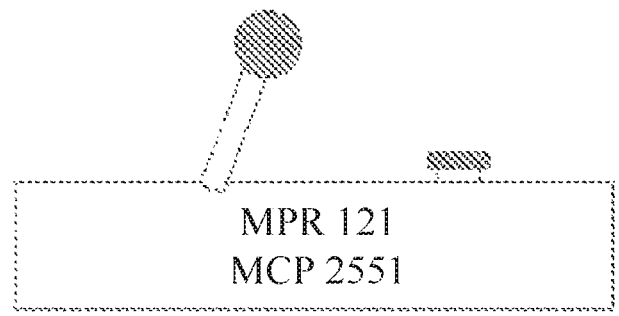
FIG. 2 is a drawing of a gear shift lever and a main control of a central console of a vehicle in which the possible location of the capacitive or other types of detection electrodes are shown as being shaded which are hidden from view.

FIG. 2 is a schematic image of the gear shift lever and the main control of the central console of the vehicle, in which the possible location of the capacitive or other types of detection electrodes are displayed in shading, which will be located after protection made of plastic, leather or other material, being able to be hidden from the view of the user. The location of the capacitive control chip and the CAN-bus connection chip can also be seen.

The invention claimed is:

1. A system for detecting activities that pose a risk during driving, comprising:
   a vehicle comprising a steering device;
   a plurality of sensors placed at various positions of the steering device configured to detect a presence of one or two hands on the steering device; and
   a processing circuitry configured to:
      identify a position of the one or two hands on the steering device or a lack thereof based on signals received from the plurality of sensors;
      determine whether to generate an alert to an operator of the vehicle based on the position of the one or two hands on the steering device or lack thereof, the alert requesting the operator of the vehicle to place one or two hands on at least one of the steering device and another authorized device;
      after a preset time period during which no movement of the one or two hands of the operator is detected, generate the alert and activate a dead-man control to control at least one of fatigue, drowsiness, lack of attention, and sabotage of the system, wherein the dead-man control requires the one or two hands of the operator to be released and placed back on the steering device in a certain synchronized sequence and order; and
      deactivate the dead-man control in response to detecting movement and position of the one or two hands of the operator in the certain synchronized sequence and order.

2. The system of claim 1, wherein:
   the plurality of sensors placed at various positions of the steering device is a first plurality of sensors; and
   the system further comprises at least:
      a second plurality of sensors placed on a main control panel of a center console of the vehicle; and
      a third plurality of sensors placed on a gear shift lever of the vehicle and other parts of the vehicle.

3. The system of claim 1, wherein individual ones of the plurality of sensors are capacitive sensors.

4. The system of claim 1, wherein the processing circuitry is a portion of a control unit, the signals received from the plurality of sensors being binary signals transmitted over communication network of the vehicle.

5. The system of claim 1, wherein the processing circuitry is further configured to:
   generate a communication to alert at least one of an operator of another vehicle, people in a surrounding area, and an emergency service; and
   use at least one of light and audible signals comprising at least one of internal flashing lights, external flashing lights, flashing hazard lights, lights, and a horn to to warn people in the surrounding area in response to detecting at least one of a possible inappropriate maneuver and an unexpected maneuver performed by the operator in response to two hands not being detected on the steering device and the other authorized device.

6. The system of claim 1, wherein the processing circuitry is further configured to access predefined window parameters in determining whether to generate the alert, the predefined window parameters being stored in memory, and customizable by a manufacturer and depending on local regulations.

7. A system for generating an alert on detecting risk activities while driving, comprising:
   a processing circuitry configured to detect risk activities performed by the operator of a vehicle in response to two hands not being detected on at least one of a steering device and another authorized device;
   an alert generation system configured to generate at least one of:
      a warning alert comprising at least one of light and audible signals generated to alert the operator to place back both hands on at least one of the the steering device and the other authorized device;
      wherein the at least one light and audible signals comprises at least one of internal flashing lights, external flashing lights, flashing hazard lights, lights, and a horn activated to communicate the warning alert to at least one of the operator, people in a surrounding area, and an emergency service in response to detecting the risk activities indicating a possible inappropriate or an unexpected maneuver performed by the operator; and
      an alert to the operator of the vehicle activated based on the position of at least one hand on the steering device or the other authorized device, or lack thereof;
   wherein the alert generation system is further configured to:
      after a preset time period during which no movement of hands of the operator are detected, activate a dead-man control to control at least one of fatigue, drowsiness, lack of attention, and sabotage of the system, wherein the dead-man control requires at least one hand of the operator to be released and placed back on the steering device in a certain synchronized sequence and order; and
      deactivate the dead-man control in response to detecting movement and position of the hands of the operator in the certain synchronized sequence and order.

8. The system of claim 7, wherein the processing circuitry is further configured to access predefined window parameters in determining whether to generate the alert, the predefined window parameters being stored in memory and customizable by the manufacturer and depending on local regulations.

9. A method for detecting activities that pose a risk during driving, comprising:
   providing a vehicle comprising a steering device;
   providing a plurality of sensors configured to detect a presence of one or two hands on the steering device;
   identifying, by a control unit of the vehicle, a position of the one or two hands on the steering device or a lack thereof based on binary signals received from the plurality of sensors;
   determining, by the control unit of the vehicle, whether to generate an alert to the operator of the vehicle based on the position of the one or two hands on the steering device or lack thereof, the alert requesting the operator of the vehicle to place one or two hands on the steering device and/or any other authorized device;
   after a preset time period during which no movement of hands of the operator are detected, generating, by the control unit of the vehicle, the alert and activate a dead-man control to control at least one of fatigue, drowsiness, lack of attention, and sabotage of the system, wherein the dead-man control requires at least one hand of the operator to be released and placed back on the steering device in a certain synchronized sequence and order; and deactivating, by the control unit of the vehicle, the dead-man control in response to detecting movement and position of the hands of the operator in the certain synchronized sequence and order.

10. The method of claim 9, wherein:

the plurality of sensors operating based on binary signals placed on respective positions of the steering device is a first plurality of sensors; and the method further comprises at least:

providing a second plurality of sensors on a main control panel of the center console of the vehicle; and providing a third plurality of sensors placed on a gear shift lever of the vehicle and other parts of the vehicle.

11. The method of claim 9, wherein said plurality of sensors are capacitive sensors.

12. The method of claim 9, further comprising:

generating a communication to alert at least one of an operator of another vehicle, people in a surrounding area, and an emergency service, and using at least one of light and audible signals comprising at least one of internal flashing lights, external flashing lights, flashing hazard lights, lights, and a horn to communicate a warning alert to people in the surrounding area in response to detecting a possible inappropriate maneuver or an unexpected maneuver performed by the operator in response to two hands not being detected on at least one of the steering device and the other authorized device.

13. The method of claim 9, further comprising accessing predefined window parameters in determining whether to generate the alert, the predefined window parameters being stored in memory, and customizable by the manufacturer and depending on local regulations.

14. The method of claim 9, further comprising detecting risk activities while driving and generating warning alerts.

* * * * *